United States Patent
Sakamoto et al.

(10) Patent No.: US 8,446,205 B2
(45) Date of Patent: May 21, 2013

(54) MIXER CIRCUIT AND METHOD FOR ADJUSTING COMMON VOLTAGE OF MIXER CIRCUIT

(75) Inventors: Shingo Sakamoto, Yokohama (JP); Jialin Ren, Yokohama (JP); Kentaro Uchida, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 160 days.

(21) Appl. No.: 13/045,234

(22) Filed: Mar. 10, 2011

(65) Prior Publication Data
US 2011/0241753 A1    Oct. 6, 2011

(30) Foreign Application Priority Data

Mar. 31, 2010   (JP) .................................. 2010-80733

(51) Int. Cl.
*G06F 7/44* (2006.01)
(52) U.S. Cl.
USPC ............ 327/356; 327/357; 327/359; 330/258
(58) Field of Classification Search
USPC ........................... 327/356, 357, 359; 330/258
See application file for complete search history.

(56) References Cited

U.S. PATENT DOCUMENTS

| | | | |
|---|---|---|---|
| 7,482,852 B1 * | 1/2009 | Samavati | 327/359 |
| 7,831,234 B2 * | 11/2010 | Schelmbauer et al. | 455/323 |
| 7,945,230 B2 * | 5/2011 | Tillman | 455/324 |

FOREIGN PATENT DOCUMENTS

| | | | |
|---|---|---|---|
| JP | 2009-518984 A | 5/2009 | |
| WO | WO 2007/068089 A1 | 6/2007 | |

* cited by examiner

*Primary Examiner* — Kenneth B. Wells
(74) *Attorney, Agent, or Firm* — Arent Fox LLP (57) ABSTRACT

A mixer circuit includes: a mixer circuit including a first transistor pair to output a first differential input signal and a second transistor pair to output a second differential input signal by inversing the first differential signal; a local signal supply circuit to supply a pair of local signals to gates of the first transistor pair and the second transistor pair; an operational amplifier including an input pair coupled to an output pair of the mixer circuit and an output pair coupled to the input pair via feedback resistors, the operational amplifier to amplify the first differential input signal and output a differential output signal; a common mode feedback circuit to control a center voltage of the differential output signal so that the center voltage maintains a common voltage; and a common voltage generator circuit to generate the common voltage according to an amplitude of the local signal.

15 Claims, 11 Drawing Sheets

MIXER CIRCUIT AND METHOD FOR ADJUSTING COMMON VOLTAGE OF MIXER CIRCUIT

CROSS-REFERENCE TO RELATED APPLICATIONS

This application claims the benefit of priority from Japanese Patent Application No. 2010-80733 filed on Mar. 31, 2010, the entire contents of which are incorporated herein by reference.

BACKGROUND

1. Field

Embodiments discussed herein relate to a mixer circuit.

2. Description of Related Art

A mixer circuit is used in components such as quadrature modulator circuits and frequency converter circuits in wireless communication equipment. The mixer circuit includes an active mixer in which a transistor has gain and a passive mixer in which a transistor acts as a switch and has no gain.

Related art is disclosed in Japanese Laid-open Patent Publication No. 2009-518984, for example.

SUMMARY

According to one aspect of the embodiments, a mixer circuit, includes: a mixer circuit including a first transistor pair to output a first differential input signal and a second transistor pair to output a second differential input signal by inversing the first differential signal; a local signal supply circuit to respectively supply a pair of local signals to the gates of the first transistor pair and the second transistor pair, the phases of local signals being inversed with each other; an operational amplifier including an input pair coupled to an output pair of the mixer circuit and an output pair coupled to the input pair via feedback resistors, the operational amplifier to amplify the first differential input signal and output a differential output signal; a common mode feedback circuit to control a center voltage of the differential output signal so that the center voltage maintains a common voltage; and a common voltage generator circuit to generate the common voltage according to an amplitude of at least one of the local signals.

Additional advantages and novel features of the invention will be set forth in part in the description that follows, and in part will become more apparent to those skilled in the art upon examination of the following or upon learning by practice of the invention.

DESCRIPTION OF EMBODIMENTS

An active mixer includes a pair of transistor switches. One transistor switch maintains a phase of an input signal and the other transistor switch inverts the phase of the input signal. When the input signal is a differential signal, a transistor is provided for each of the in-phase input signal and the reversed input signal. A local signal and a local signal with a reversed phase are supplied to the gates of transistors, respectively.

A passive mixer, which has low power consumption and operates at high speed, quadrature-demodulates or down-converts a high-frequency signal. The local signal that drives the transistor may have a large amplitude.

Since the buffer amp that supplies the local signal operates at high frequency and has low power consumption, the buffer amp may include MOS transistors for high-frequency operation, and the operating voltage of the buffer amp may be small. Since MOS transistors for high-frequency operation have short gate lengths and thin gate oxide films, the operating voltage of the buffer amp is preferably small.

If the operating voltage of the buffer amp is small, the amplitude voltage of the local signal may become small.

Figure 1:
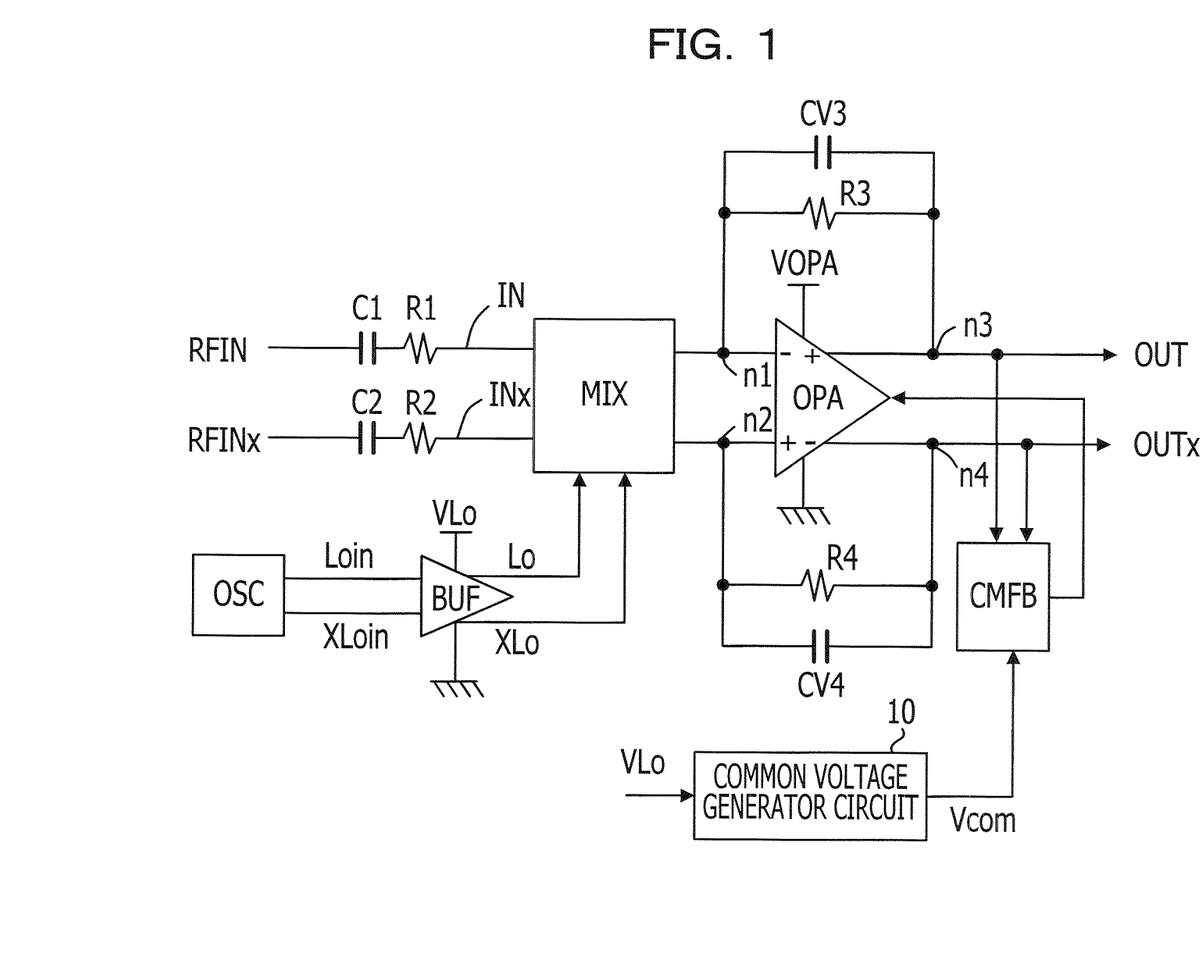
FIG. 1 illustrates an exemplary mixer circuit.

FIG. 1 illustrates an exemplary mixer circuit. The mixer circuit includes input resistors R1 and R2, a mixer unit MIX which includes a passive mixer, and an op-amp OPA which includes feedback resistors R3 and R4. Differential high-frequency input signals RFIN and RFINx are input via input capacitors C1 and C2 which cut the DC component from the signals. In the op-amp OPA, feedback resistors R3 and R4 and feedback capacitors CV3 and CV4 are provided between the input resistors R1 and R2 and the input pair n1 and n2 and between the input resistors R1 and R2 and the output pair n3 and n4, respectively. The op-amp OPA is coupled between a power supply voltage VOPA and ground GND. The mixer unit MIX is provided between the input resistors R1 and R2 and the virtual ground nodes n1 and n2 which correspond to the input pair of the op-amp OPA.

A common mode feedback circuit CMFB is provided so that the DC voltage of the differential input signals and the output signals of the op-amp OPA, for example, the common voltage becomes a certain voltage Vcom. The common mode feedback circuit CMFB may control the op-amp OPA so that the intermediate voltage of the differential output signals OUT and OUTx from the output pair of the op-amp OPA becomes a common voltage Vcom.

The DC component of the differential input signals RFIN and RFINx are cut by the capacitors C1 and C2, and the differential components of the differential input signals are input. Since the differential components are zero when no differential input signals are input, the voltages at the input pair IN and INx of the mixer unit MIX, at the virtual ground nodes n1 and n2 corresponding to the input pair of the op-amp OPA, and at the output pair n3 and n4 may become the common voltage Vcom. When differential input signals RFIN and RFINx are input, a voltage of the virtual ground nodes n1 and n2 of the op-amp is maintained the common voltage Vcom, while the voltages at the input pair IN and INx of the mixer unit MIX and the output OUT and OUTx of the op-amp become differential signals having the common voltage Vcom as a central voltage.

Figure 2:
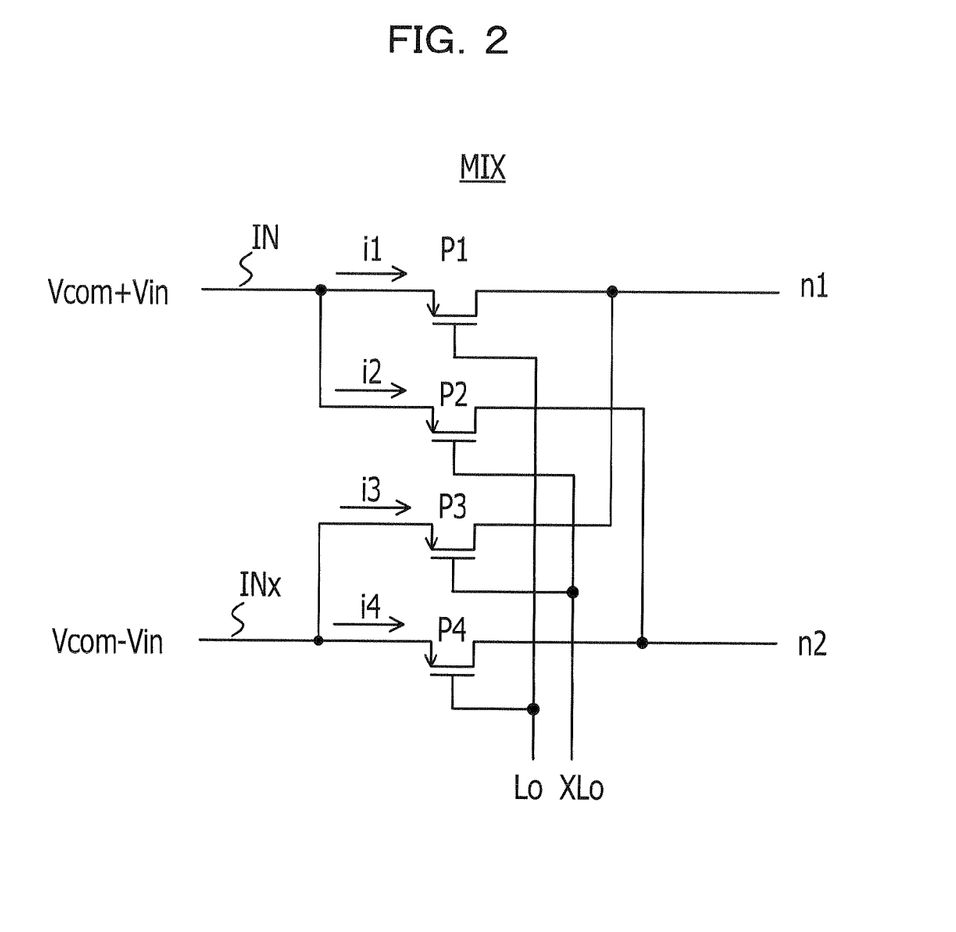
FIG. 2 illustrates an exemplary mixer circuit.

FIG. 2 illustrates an exemplary mixer circuit. The mixer unit MIX illustrated in FIG. 2 may be a passive mixer, and includes a switch having n-channel MOS transistors or p-channel MOS transistors. The switch illustrated in FIG. 2 includes p-channel MOS transistors P1 to P4.

The mixer unit MIX includes a first transistor pair P1 and P4, and a second transistor pair P2 and P3. The first transistor pair P1 and P4 output the differential input signals IN=Vcom+Vin and INx=Vcom−Vin of the input terminals IN and INx without changing the phase. The second transistor pair P2 and P3 reverses the differential input signals and outputs the reversed differential signal. A positive local signal Lo is supplied to the gates of the first transistor pair P1 and P4, while a local signal XLo having the reverse phase of the local signal Lo is supplied to the gates of the second transistor pair P2 and P3. Since the local signals Lo and XLo have complementary phases, the first transistor pair P1 and P4 and the second transistor pair P2 and P3 repeat to become conductive and non-conductive, alternately, according to the frequency of the local signals.

As illustrated in FIG. 1, the local signals Lo and XLo are generated by a buffer amp BUF that shapes the waveforms of the local signals Loin and XLoin generated by an oscillator OSC. The buffer amp BUF may include a CMOS circuit, for example, and receive a power supply voltage VLo. Since the amplitude voltage of the local signals Lo and XLo becomes substantially equal to the power supply voltage VLo of the buffer amp, the local signals Lo and XLo supplied to the mixer unit MIX become high-frequency signals that repeatedly alternate between the ground voltage 0 V and the amplitude voltage VLo. When the local signal Lo is at a low level and the reverse phase XLo is at a high level, the transistor pair P1 and P4 becomes conductive while the transistor pair P2 and P3 becomes non-conductive. As a result, the differential input signals Vcom+Vin and Vcom−Vin are output to n1 and n2 on the output side with their phases being unchanged. When the local signal Lo is at a high level and XLo is at a low level, the transistor pair P1 and P4 becomes non-conductive, while the transistor pair P2 and P3 becomes conductive. As a result, the high-frequency input signals Vcom+Vin and Vcom−Vin are output to n1 and n2 on the output side with their phases being inverted.

Figure 3:
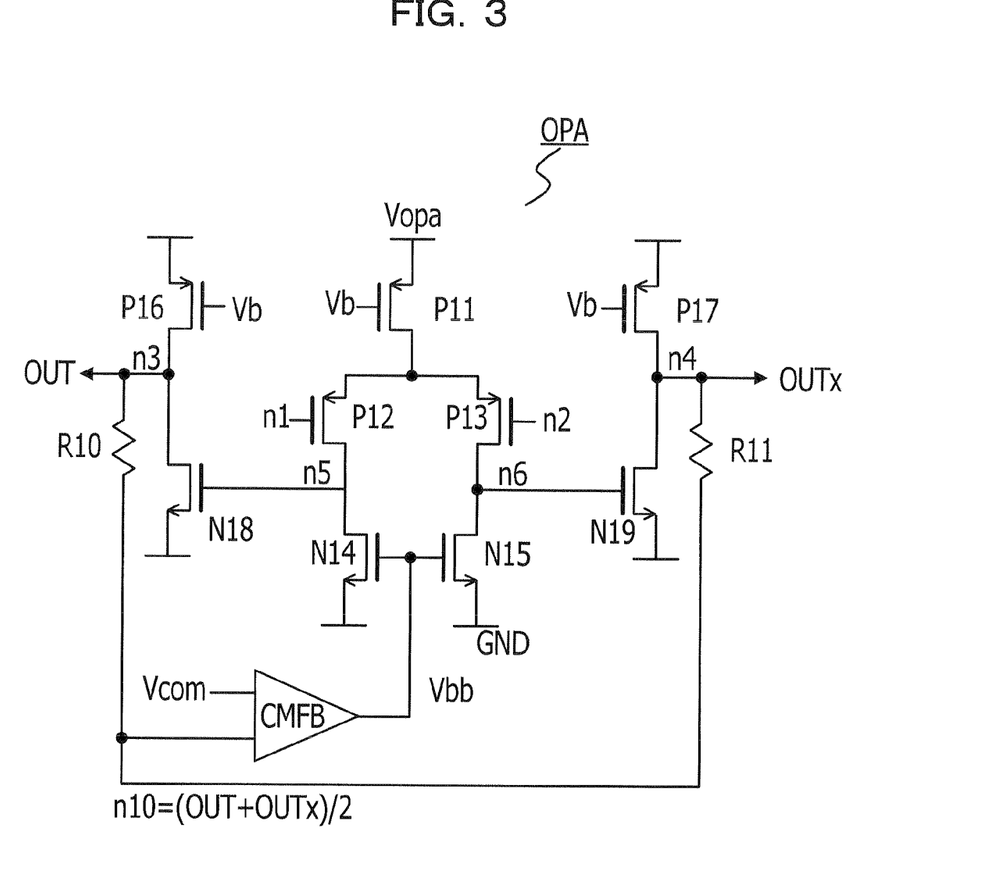
FIG. 3 illustrates an exemplary op-amp and an exemplary common mode feedback circuit.

FIG. 3 illustrates an exemplary op-amp and an exemplary common mode feedback circuit. The op-amp OPA includes, as a differential amplifier stage, p-channel transistors P12 and P13 whose gates are coupled to the input pair n1 and n2, a p-channel current supply transistor P11 which is provided between a common source of the p-channel transistors P12 and P13 and a power supply voltage VOPA and has a gate coupled to a bias voltage Vb, and n-channel transistors N14 and N15 provided between the drains of the transistors P12 and P13 and ground GND. The op-amp OPA includes, as an output buffer stage, transistors P16 and N18 on the OUT side of the output, and transistors P17 and N19 on the OUTx side of the output.

The transistors P12 and P13 amplify the potential difference between the input pair n1 and n2, and generate amplified signals for the drain terminals n5 and n6. The n-channel transistors N18 and N19 in the output buffer stage are driven by the amplified signals. The voltages of the outputs OUT and OUTx become amplified voltages in accordance with the potential difference between the input pair n1 and n2.

The op-amp OPA drives the outputs OUT and OUTx according to the differential components Vin and −Vin in the differential input signals Vcom+Vin and Vcom−Vin so that voltages of the virtual ground nodes n1 and n2 corresponding to the input pair become substantially the same with each other.

The common mode feedback circuit CMFB may include a differential amplifier. The common mode feedback circuit CMFB compares a voltage to the node n10, which is coupled to the output pair n3 and n4 of the op-amp OPA via the resistors R10 and R11, with a common voltage Vcom and generates the bias voltage Vbb of the n-channel transistors N14 and N15 in the differential amplifier stage of the op-amp. The common mode feedback circuit CMFB generates the gate Vbb for the n-channel transistors N14 and N15 in the differential amplifier stage of the op-amp so that the intermediate voltage (OUT+OUTx)/2 between the output voltages OUT and OUTx of the op-amp OPA is maintained at the common voltage Vcom.

For example, when the intermediate voltage (OUT+OUTx)/2 between the output voltages OUT and OUTx increases, the differential amplifier of the common mode feedback circuit CMFB decreases the bias voltage Vbb. The on-resistance of the transistors N14 and N15 increases, and the potential of the nodes n5 and n6 increases. As a result, the on-resistance of the transistors N18 and N19 decreases, and the output voltages OUT and OUTx also decrease. When the intermediate voltage (OUT+OUTx)/2 between the output voltages OUT and OUTx decreases, the reverse of the above operation is performed. The intermediate voltage (OUT+OUTx)/2 between the output voltages OUT and OUTx is maintained at the common voltage Vcom.

Since the common mode feedback circuit CMFB maintains the intermediate voltage (OUT+OUTx)/2 between the output voltages OUT and OUTx at the common voltage Vcom, the virtual ground nodes n1 and n2 of the op-amp OPA are maintained at the common voltage Vcom and the DC level of the differential input signals supplied to the input terminals IN and INx of the mixer unit MIX via the input resistors R1 and R2 is set to the common voltage Vcom. The differential components Vin and −Vin of the complementary differential input signals Vcom+Vin and Vcom−Vin are amplified, and complementary differential output signals OUT and OUTx having the common voltage Vcom as the DC component are generated.

The gain of the mixer circuit inside the op-amp OPA is as follows.

Gain [dB]=20×log {op-amp output resistance $R3(R4)$/
(mixer unit input resistance $R1(R2)$+mixer unit
transistor on-resistance)}−mixer unit conversion
loss [dB]

The mixer unit conversion loss includes frequency components other than the desired frequency generated by the mixer circuits.

Figure 4:
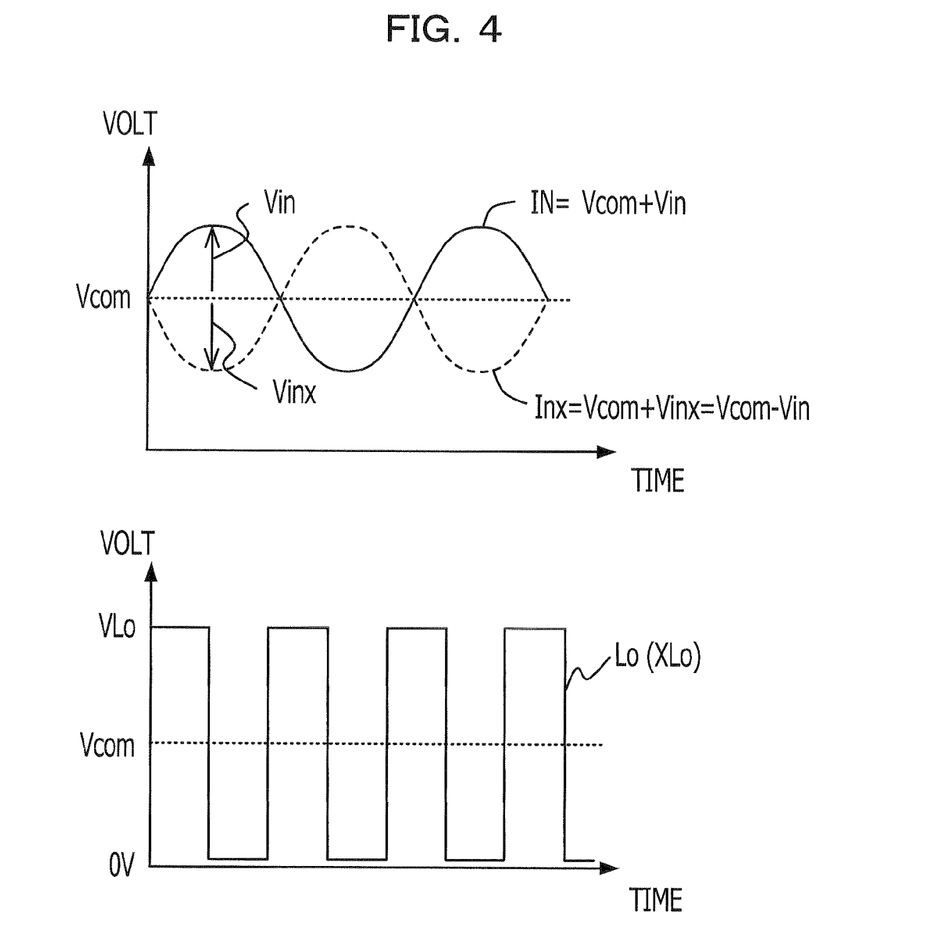
FIG. 4 illustrates an exemplary input signal and an exemplary local signal.

FIG. 4 illustrates an exemplary input signal and an exemplary local signal. In FIG. 4, IN and INx represent input signals of a mixer circuit, while Lo and XLo represent local signals. The input signals Vcom+Vin and Vcom−Vin may have opposite phases with each other and vary at the differential components Vin and Vinx=−Vin respectively.

The local signal Lo may be a pulse signal having a high level substantially equal to a voltage VLo and a low level substantially equal to the ground voltage 0 V. Although not illustrated in FIG. 4, the local signal XLo may be a pulse signal having the inverse phase of the local signal Lo. The transistors P1 to P4 inside the mixer unit MIX operate centered about the common voltage Vcom of the virtual ground nodes n1 and n2. The transistors P1 to P4 switch off when the local signals Lo and XLo are at the high level, and switch on when the local signals Lo and XLo are at the low level. For this reason, the amplitude voltage of the local signals Lo and XLo may be selected so that the local signals Lo and XLo switch the transistors P1 to P4 on or off.

In FIG. 2, for example, when the inputs IN and INx of the mixer unit MIX are the source and the voltage of the input signal Vcom+Vin is at a highest point, the transistors P1 to P4 may be switched off by the high-level (VLo) local signal Lo (or XLo) that is applied to the gate. When the voltage of the input signal is at a lowest point, the transistors P1 to P4 may be switched on by the low-level (GND) local signal Lo (or XLo).

Since the amplitude voltage VLo of the local signals Lo and XLo are set to substantially the same voltage as the power supply voltage VOPA of the op-amp OPA, the transistors P1 to P4 inside the mixer unit MIX are switched on and off. For example, when the power supply voltage VOPA is 3 V, the common voltage Vcom may be equal to 1.5 V, and the amplitude voltage VLo of the local signals Lo and XLo may be 3 V.

When the amplitude voltage of the local signals Lo and XLo is set to a voltage that is greater than the common voltage Vcom, the mixer unit MIX may not operate at high frequency. The mixer circuit may operate based on high-frequency local signals. For this reason, the buffer amp BUF supplied with the local signals may include high-speed transistors with short gate lengths. Gate oxide films of MOS transistors having short gate lengths may be thin and a breakdown voltage might not be large. For this reason, the power supply voltage VLo of the buffer amp BUF may be small.

Increasing the power supply voltage VLo of the buffer amp BUF and increasing the amplitude voltage of the local signals Lo and XLo may cause power consumption to increase.

The power supply voltage VLo of the buffer amp BUF may be set lower than the common voltage Vcom in order to make the buffer amp BUF supplied with the local signals operate at high frequency and to reduce power consumption. For this reason, the amplitude voltage VLo of the local signals might be set lower than the common voltage Vcom.

Figure 5:
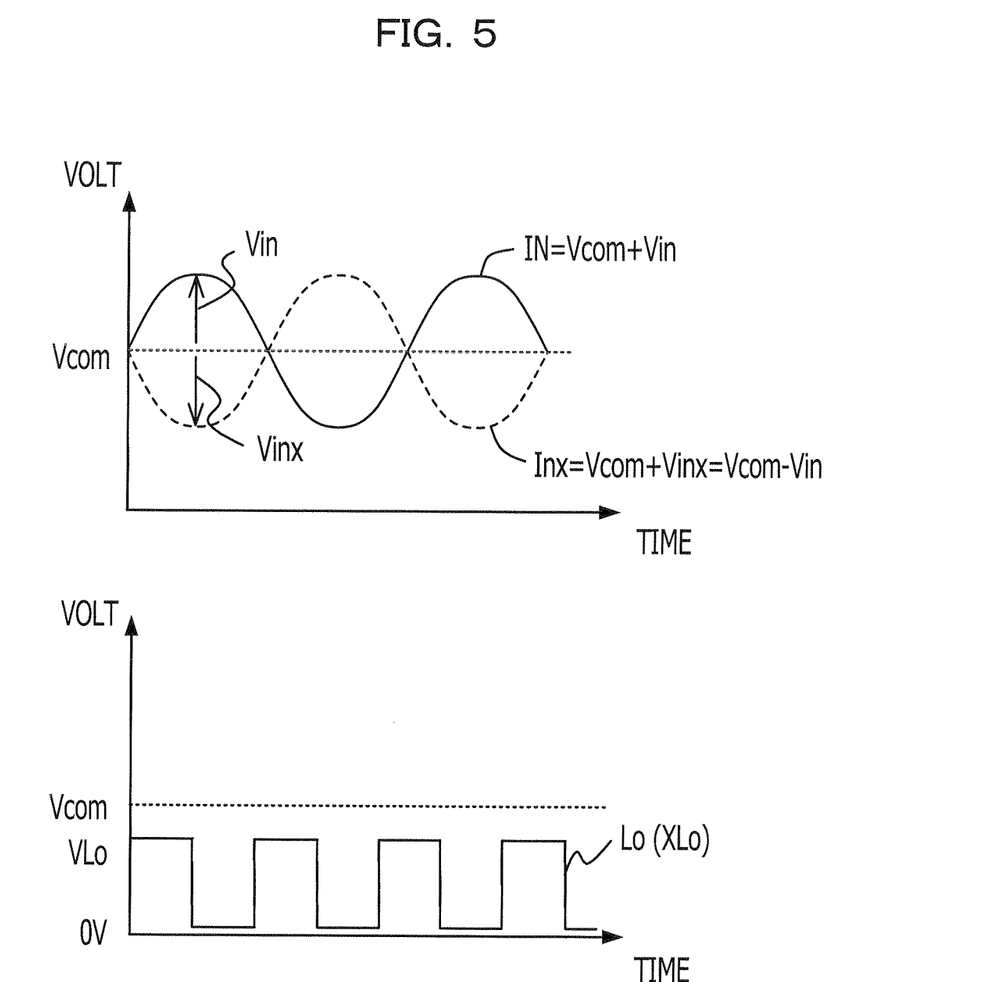
FIG. 5 illustrates an exemplary input signal and an exemplary local signal.

FIG. 5 illustrates an exemplary input signal and an exemplary local signal. In FIG. 5, IN and INx represent the input signals of the mixer circuit and Lo and XLo represent local signals. The input signals Vcom+Vin and Vcom-Vin may be substantially the same as or similar to the input signals illustrated in FIG. 4. The amplitude voltage VLo of the local signal Lo is lower than the common voltage Vcom. Although not illustrated in FIG. 5, the amplitude voltage VLo of the local signal XLo may be similar.

Since the amplitude voltage VLo of the local signals Lo and XLo is small, the power supply voltage VLo of the buffer amp BUF becomes small. For this reason, the buffer amp may include CMOS transistors capable of high-frequency operation. Consequently, the frequency of the local signals is increased and power consumption in the buffer amp BUF is decreased.

As a result of the lowered amplitude voltage VLo of the local signals, the amplitude voltage VLo and the common voltage Vcom may satisfy the following two conditions. The first condition stipulates that when the input signals Vcom+Vin and Vcom-Vin are at their maximum levels, the transistors P1 to P4 inside the mixer unit MIX switch off by the high-level (VLo) local signals Lo and XLo. The second condition stipulates that when the transistors P1 to P4 are switched on, the source-drain current changes linearly with respect to the source-drain voltage in the same manner as the resistors R1 to R4, so that the resistance to conduction becomes substantially constant.

The common voltage generator circuit 10 illustrated in FIG. 1 generates the common voltage Vcom based on the amplitude voltage VLo of the local signals so as to satisfy at least one of the above two conditions.

With the first condition, the transistors P1 to P4 are switched off based on the high-level (=VLo) local signals Lo and XLo when the input signals Vcom+Vin and Vcom-Vin reach their maximum values. The gate-source voltage Vgs of the transistor is smaller than the threshold value Vth of the transistor (Vgs<Vth). If the input signal voltage when the transistors are switched off is taken to be Vcom+Vin(off), the following equation may be established.

$$Vgs=(Vcom+Vin(off))-VLo<Vth \quad (1)$$

The relationship expressed in equation (2) is obtained from equation (1).

$$Vin(off)<Vth-Vcom+VLo \quad (2)$$

With the second condition, the transistors operate linearly based on the low-level (=0 V) local signals Lo and XLo when the input signals Vcom+Vin and Vcom-Vin reach their minimum values. The condition of linear operation is as follows.

$$Vds<Vgs-Vth \quad (3)$$

The overdrive voltage (Vgs-Vth) with respect to the threshold voltage Vth of the gate-source voltage Vgs of the transistor is larger than the source-drain voltage Vds. When the input signal voltage that satisfies the condition expressed in equation (3) is Vcom+Vin(on), the source-drain voltage Vds is the difference between the voltage Vcom of the virtual ground nodes n1 and n2 and the input signal Vcom+Vin(on), and the gate-source voltage Vgs is the difference between the input signal Vcom+Vin(on) and ground (0 V), the equation (3) becomes $$Vds=Vcom-(Vcom+Vin(on))<(Vcom+Vin(on))-Vth.$$

The input signal differential component Vin(on) that satisfies the equation (3) becomes as follows.

$$-Vin(on)<(Vcom-Vth)/2 \quad (4)$$

where Vin(on)<0.

Figure 6:
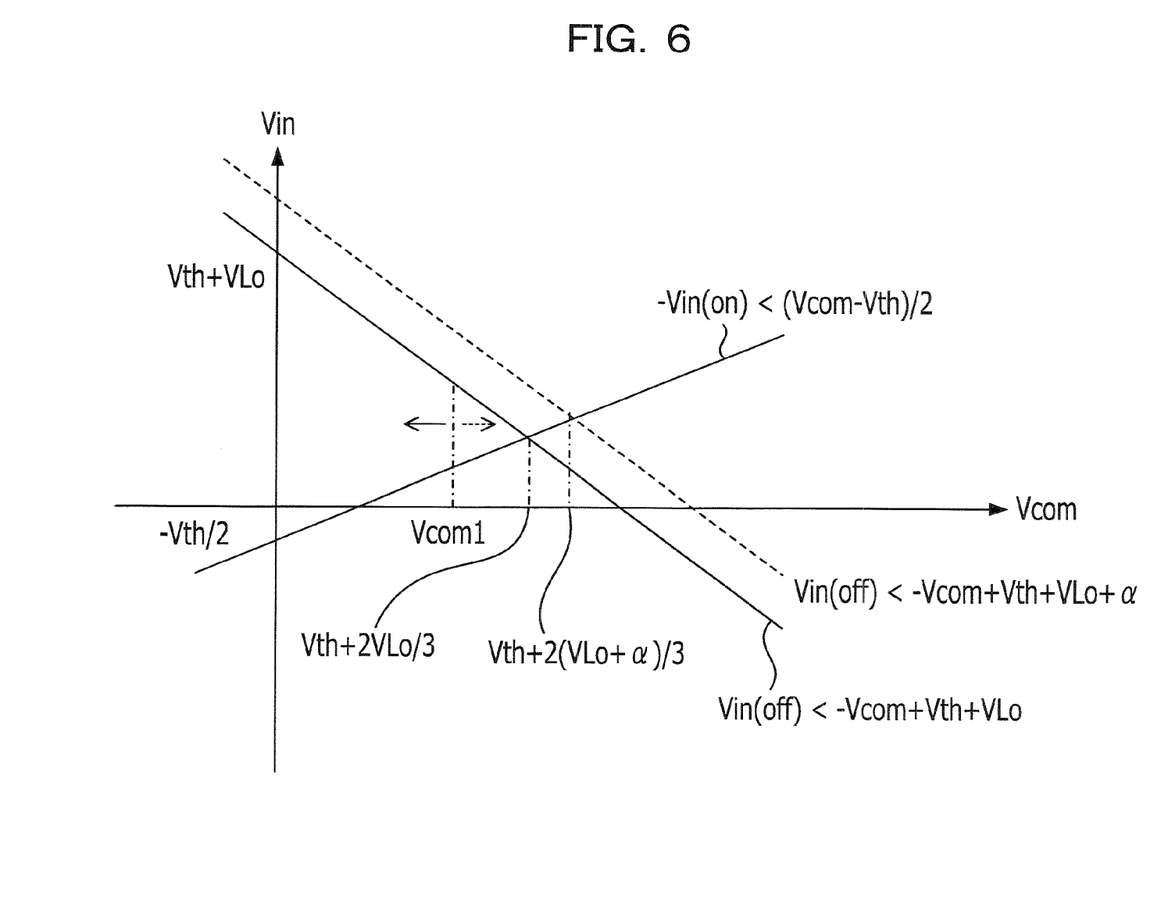
FIG. 6 illustrates an exemplary differential component of an input signal.

FIG. 6 illustrates an exemplary differential component of an input signal. FIG. 6 illustrates Vin(off) expressed in the equation (2), as well as -Vin(on) expressed in the equation (4). The horizontal axis represents the common voltage Vcom, while the vertical axis represents the input signal differential component Vin. The region below the first-order lines Vin(off) and Vin(on) indicated by solid lines may be the range where the common voltage Vcom and the input signal differential component Vin can be taken. The input signal differential component Vin is maximized at a point where the first-order line in the equation (2) and the first order line in the equation (4) intersect.

When a value of the equation (2) and a value of the equation (4) become substantially equal, for example, when Vin(off)=-Vin(on), the relationship Vth-Vcom+VLo=(Vcom-Vth)/2 is established, and Vcom becomes as follows.

$$Vcom=Vth+(\tfrac{2}{3})*VLo \quad (5)$$

When generating a common voltage Vcom that satisfies the equation based on the amplitude voltage VLo of the local signals, the first condition and the second condition may be satisfied, and the range of input signal differential components may be widened.

Figure 7:
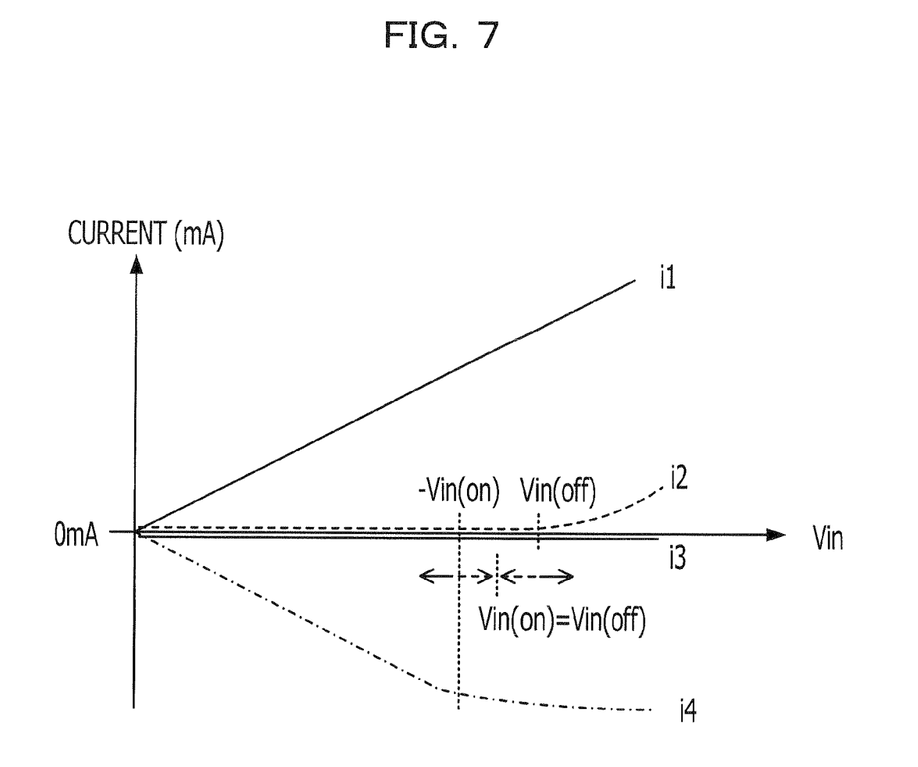
FIG. 7 illustrates an exemplary differential component of an input signal.

FIG. 7 illustrates an exemplary differential component of an input signal. FIG. 7 illustrates the relationship between the drain-source current of the transistors P1 to P4 inside the mixer unit, and the input signal differential component Vin. FIG. 7 illustrates the respective currents i1 to i4 of the conducting transistors P1 and P4 as well as the non-conducting transistors P2 and P3 when the local signal Lo equals 0 V and XLo equals VLo. FIG. 7 illustrates the differential components −Vin(on) and Vin(off) when the common voltage is Vcom1 illustrated in FIG. 6.

The transistor P1 becomes conductive based on the local signal Lo=0 V. Because of the ample gate-source voltage, the current varies linearly with respect to increases and decreases in the input signal differential component Vin. Since the transistor P4 receives the input signal Vcom−Vin as input, the transistor P4 may not operate linearly. The current varies linearly with respect to the input voltage Vin as long as the input signal differential component Vin does not exceed −Vin(on). The current saturates and becomes non-linear when the input signal differential component Vin exceeds −Vin(on).

The local signal XLo=VLo is applied to the transistor P3. Since the input signal Vcom-Vin is input, the transistor P3 is in a non-conductive state. Since the transistor P2 receives the input signal Vcom+Vin, the transistor P2 may not be in a non-conductive state. The transistor P2 is in non-conductive as long as the input signal differential component Vin does not exceed Vin(off). A current may occur when the input signal differential component Vin exceeds Vin(off).

In FIG. 6, when the common voltage Vcom is decreased (as indicated by the solid arrow in FIG. 6), the voltage Vin(off) increases and −Vin(on) decreases. When the common voltage Vcom is increased (as indicated by the broken arrow in FIG. 6), the voltage Vin(off) decreases and −Vin(on) increases. Similarly, when the common voltage Vcom is increased, the voltage Vin(off) and −Vin(on) move in opposite directions as indicated by the solid arrows and broken arrows in FIG. 7.

The relationship between the common voltage Vcom and the local signal amplitude voltage VLo for maximizing the range of the input signal differential component Vin is set when Vin(off)=−Vin(on).

In FIG. 7, the current i4 of the transistor P4 rapidly saturates when the differential component Vin exceeds Vin(on). The current i2 of the transistor P2 gently increases when the differential component Vin exceeds Vin(off). When the input signal differential component Vin(off) for making a transistor non-conductive does not satisfy the condition in the equation (2), the current i2 flowing through the transistor P2 may be very small.

The operational range of the input signal differential component Vin may be widened by correcting the equation (2) as follows.

$$Vin(off) < Vth - Vcom + VLo + \alpha \quad (2A)$$

The relationship between the common voltage Vcom and the local signal amplitude voltage VLo expressed in the equation (5) is corrected as follows.

$$Vcom = Vth + (2/3)*(VLo + \alpha) \quad (5A)$$

The broken line illustrated in FIG. 6 may correspond to a graph of the equation (5A).

The value $\alpha$ may be a voltage that is approximately 8% to 12% of the amplitude voltage VLo. For example, when VLo equals 1.2 V, $\alpha$ may be approximately 0.1 V. When Vth=0.5 V, VLo=1.2 V, and $\alpha$=0.1 V, for example, the common voltage Vcom may be approximately 1.3666 V, and −Vin(on) and Vin(off) may both equal 0.433 V. As illustrated in FIG. 5, the local signal amplitude voltage VLo (1.2 V) is smaller than the common voltage Vcom (1.3666 V). For this reason, the differential components Vin and Vinx=−Vin of the input signals RFIN and RFINx increase to a maximum of 0.433 V.

Figure 8A:
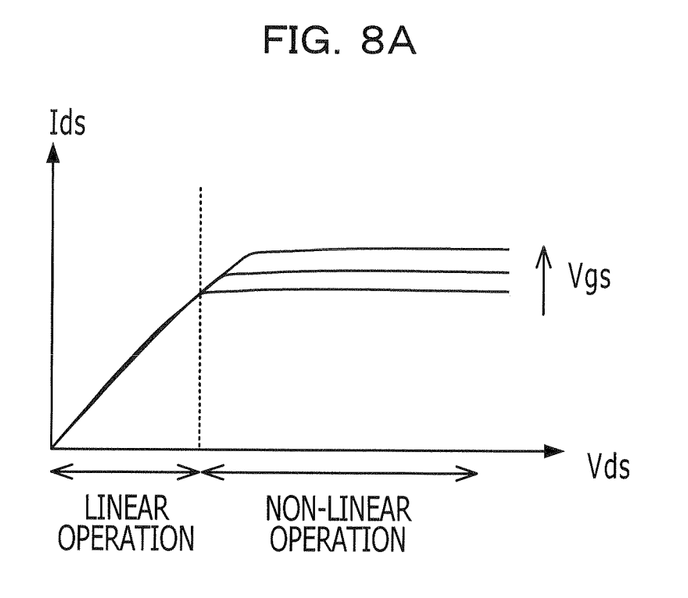
FIGS. 8A and 8B illustrate exemplary operating characteristics of a transistor.
Figure 8B:
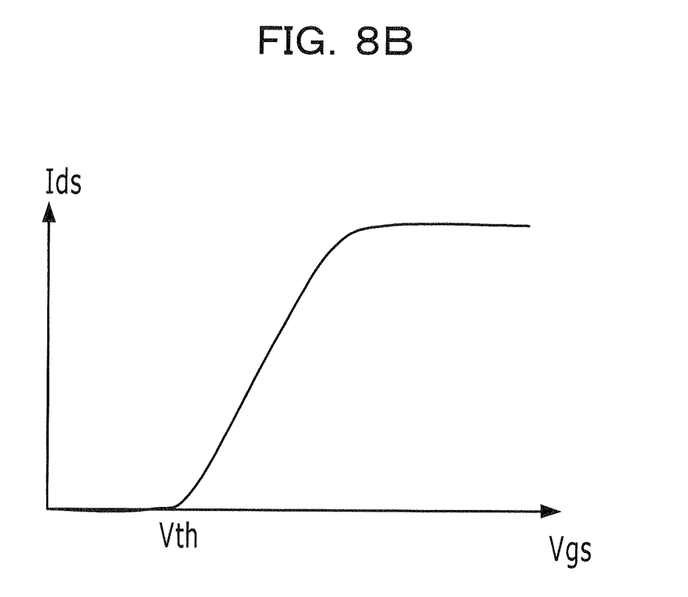

FIGS. 8A and 8B illustrate exemplary operating characteristics of a transistor. FIG. 8A illustrates a relationship between Vds, Ids, and Vgs. In a region where Vds and Ids are in a linear relationship, Vgs increases as Vds increases, and thus the overdrive voltage Vgs-Vth with respect to the threshold value Vth may become greater than Vds. As illustrated in FIG. 8A, in a region of non-linear operation, Vgs is not large. FIG. 8B illustrates the relationship between Vgs and Ids. Ids increases when Vgs increases than Vth.

Figure 9:
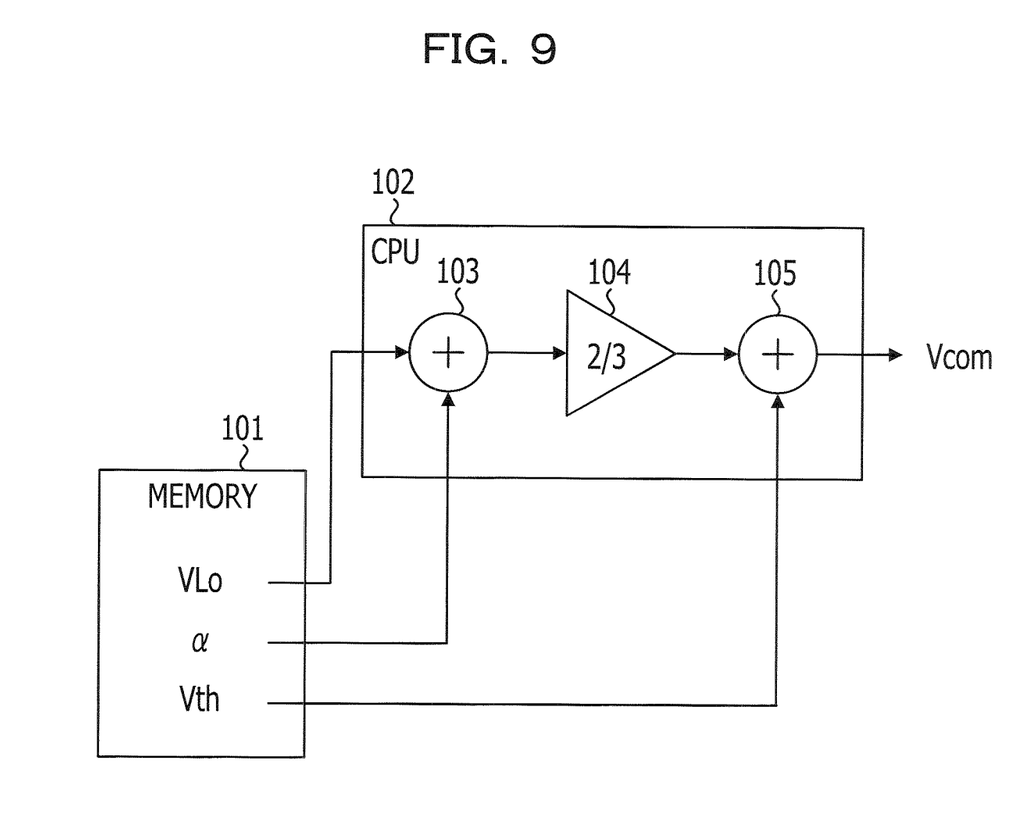
FIG. 9 illustrates an exemplary common voltage generator circuit.

FIG. 9 illustrates an exemplary common voltage generator circuit. The memory 101 of the common voltage generator circuit 10 stores the local signal amplitude voltage VLo, the value $\alpha$, and the transistor threshold value Vth. The processor 102 generates the common voltage Vcom by an add operation 103 that adds together VLo and $\alpha$; a multiply operation 104 that multiplies the added value (VLo+$\alpha$) by ⅔; and an add operation 105 that adds together the multiplication result (⅔)*(VLo+$\alpha$) and the threshold value Vth. The common voltage Vcom is converted into an analog voltage by a DA converter not illustrated, and is supplied to the gate of the current supply transistor N19 of the op-amp OPA.

In FIG. 9, VLo, $\alpha$, and Vth may be set in advance. For this reason, the common voltage Vcom corresponding to Vcom−Vth+(⅔)*(VLo+$\alpha$) in the equation (5A) may be computed at a design stage, and stored in the memory 101.

Figure 10:
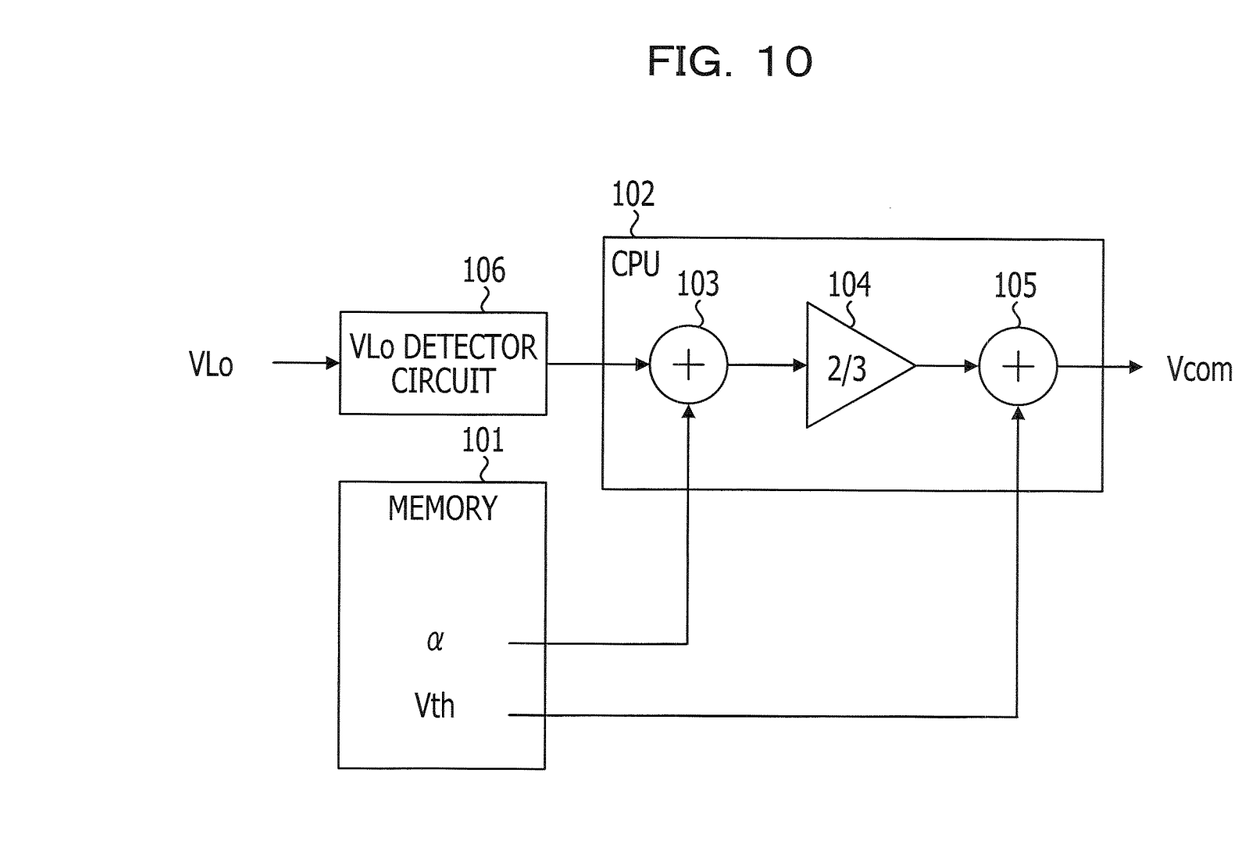
FIG. 10 illustrates an exemplary common voltage generator circuit.

FIG. 10 illustrates an exemplary common voltage generator circuit. The memory 101 of the common voltage generator circuit 10 stores the value $\alpha$ and the transistor threshold value Vth. The amplitude voltage VLo is detected by an amplitude voltage detector circuit 106. The processor 102 generates the common voltage Vcom by an add operation 103 that adds together VLo and $\alpha$, a multiply operation 104 that multiplies the added value (VLo+$\alpha$) by ⅔, and an add operation 105 that adds together the multiplication result (⅔)*(VLo+$\alpha$) and the threshold value Vth.

Figure 11:
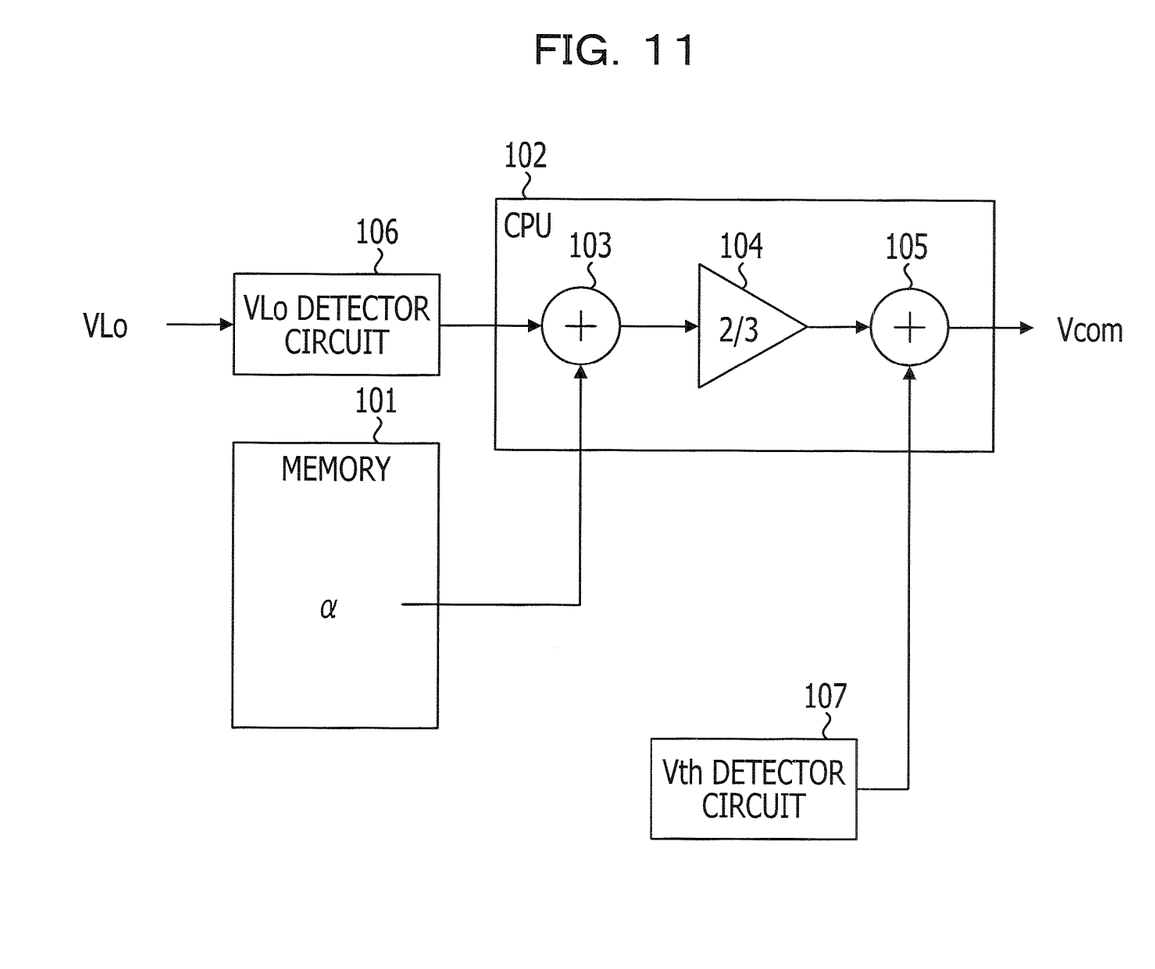
FIG. 11 illustrates an exemplary common voltage generator circuit.

FIG. 11 illustrates an exemplary common voltage generator circuit. The memory 101 of the common voltage generator circuit 10 stores the value $\alpha$. The amplitude voltage VLo is detected by an amplitude voltage detector circuit 106, and the threshold voltage Vth is detected by a threshold voltage detector circuit 107. The processor 102 generates the common voltage Vcom by an add operation 103 that adds together VLo and $\alpha$, a multiply operation 104 that multiplies the added value (VLo+$\alpha$) by ⅔, and an add operation 105 that adds together the multiplication result (⅔)*(VLo+$\alpha$) and the threshold value Vth.

The analog output from the VLo detector circuit 106 and the threshold voltage detector circuit 107 is analog-digital-converted and input into the processor 102. The output Vcom from the processor 102 is digital-analog-converted and supplied to the gate of the current supply transistor N19 of the op-amp.

The amplitude voltage VLo of the local signals Lo and XLo is set smaller than the common voltage Vcom. The common voltage Vcom is set based on the amplitude voltage VLo so as to ensure non-conductive operation of the transistors inside the mixer unit and linear operation of the transistors in a conductive state. For this reason, the buffer amp that supplies the local signals operates at high speed, and its power consumption is also reduced.

When the amplitude voltage VLo is set to V1, the common voltage Vcom of the common mode feedback circuit of the op-amp is set to Vcom=Vth+(⅔)*(V1+$\alpha$) or Vcom=Vth+(⅔)*V1. When the amplitude voltage VLo is set to V2, the common voltage Vcom of the common mode feedback circuit of the op-amp is set to Vcom=Vth+(⅔)*(V2+$\alpha$) or Vcom=Vth+(⅔)*V2. For this reason, the common voltage Vcom is adjusted so that the transistors inside the mixer unit operate properly.

Example embodiments of the present invention have now been described in accordance with the above advantages. It will be appreciated that these examples are merely illustrative of the invention. Many variations and modifications will be apparent to those skilled in the art.

The invention claimed is:

1. A mixer circuit, comprising:
 a mixer circuit including a first transistor pair to output a first differential input signal and a second transistor pair to output a second differential input signal;
 a local signal supply circuit to respectively supply a pair of local signals to the gates of the first transistor pair and the second transistor pair, the phases of local signals being complementary to each other;
 an operational amplifier including an input pair coupled to an output pair of the mixer circuit and an output pair coupled to the input pair via feedback resistors, the operational amplifier to amplify the first differential input signal and output a differential output signal;
 a common mode feedback circuit to output a control signal to the operational amplifier so that a center voltage of the differential output signal maintains a common voltage; and
 a common voltage generator circuit to generate the common voltage according to an amplitude of at least one of the local signals.

2. The mixer circuit according to claim 1, wherein each of the transistors included in the first transistor pair includes a PMOS transistor and each of the transistors included in the second transistor pair includes a PMOS transistor.

3. The mixer circuit according to claim 1, wherein the common voltage generator circuit adjusts the common voltage so that it is equal to or greater than the amplitude of the at least one of the local signals.

4. The mixer circuit according to claim 1, wherein the common voltage generator circuit adjusts the common voltage to a first common voltage when the amplitude is a first amplitude, and adjusts the common voltage to a second common voltage lower than the first common voltage when the amplitude is a second amplitude smaller than the first amplitude.

5. The mixer circuit according to claim 1, wherein the common voltage generator circuit adjusts the common voltage to become a voltage obtained by adding a ⅔ of the amplitude to a threshold voltage of at least one of the first transistor pair and the second transistor pair.

6. The mixer circuit according to claim 1, wherein the common voltage generator circuit adjusts the common voltage to become a voltage obtained by adding a ⅔ of an addition of the amplitude and a voltage to a threshold voltage of at least one of the first transistor pair and the second transistor pair.

7. The mixer circuit according to claim 6, wherein the voltage is substantially 8% to 12% of the amplitude.

8. A common voltage adjusting method, comprising:
 outputting a first differential input signal via a first transistor pair and outputting a second differential input signal via a second transistor pair;
 supplying a pair of local signals to the gates of the first transistor pair and the second transistor pair respectively, the phases of local signals being complementary to each other;
 amplifying the first differential input signal using an operational amplifier and outputting a differential output signal; and
 outputting a control signal to the operational amplifier to adjust a center voltage of the differential output signal to a common voltage according to an amplitude of at least one of the local signals.

9. The common voltage adjusting method according to claim 8, further comprising:
 supplying the differential output signal to a pair of input terminals supplied with the first differential input signals via feedback resistors.

10. The common voltage adjusting method according to claim 8, further comprising:
 each of the transistors included in the first transistor pair includes a PMOS transistor and each of the transistors included in the second transistor pair includes a PMOS transistor.

11. The common voltage adjusting method according to claim 8, further comprising, adjusting the common voltage to be substantially equal to or greater than the amplitude.

12. The common voltage adjusting method according to claim 8, further comprising: adjusting the common voltage a first common voltage when the amplitude is a first amplitude; and adjusting the common voltage to a second common voltage lower than the first common voltage when the amplitude is a second amplitude lower than the first amplitude.

13. The common voltage adjusting method according to claim 8, further comprising, adjusting the common voltage to a voltage obtained by adding a ⅔ of the amplitude to a threshold voltage of at least one of the first transistor pair and the second transistor pair.

14. The common voltage adjusting method according to claim 8, further comprising, adjusting the common voltage to a voltage obtained by adding a ⅔ of a sum of the amplitude and a voltage to a threshold voltage of at least one of the first transistor pair and the second transistor pair.

15. The common voltage adjusting method according to claim 14, wherein the voltage is substantially 8% to 12% of the amplitude.

* * * * *